(12) United States Patent
Munoz-Bustamante et al.

(10) Patent No.: US 6,229,712 B1
(45) Date of Patent: May 8, 2001

(54) PRINTED CIRCUIT BOARD FOR COUPLING SURFACE MOUNTED OPTOELECTRIC SEMICONDUCTOR DEVICES

(75) Inventors: Carlos Munoz-Bustamante, Durham; Daniel McConnell, Raleigh, both of NC (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/282,307

(22) Filed: Mar. 31, 1999

(51) Int. Cl.[7] ..................................... H05K 7/02
(52) U.S. Cl. .................... 361/783; 361/783; 361/748; 361/760; 361/679; 361/683; 361/686; 174/260; 174/266; 257/80; 257/81; 257/84; 257/98; 385/93; 385/54
(58) Field of Search ..................... 361/783, 748, 361/760, 679, 683, 686, 765, 807; 174/260, 266; 257/773, 774, 98, 80, 84, 81; 385/93, 54

(56) References Cited

U.S. PATENT DOCUMENTS

| | | | |
|---|---|---|---|
| 4,720,634 | 1/1988 | D'Auria et al. | 250/551 |
| 4,732,446 * | 3/1988 | Gipson et al. | 385/24 |
| 4,838,630 | 6/1989 | Jannson et al. | 359/3 |
| 5,093,879 * | 3/1992 | Bregman et al. | 385/93 |
| 5,093,890 | 3/1992 | Bregman et al. | 385/146 |
| 5,096,279 | 3/1992 | Hornbeck et al. | 359/230 |
| 5,283,447 | 2/1994 | Olbright et al. | 257/85 |
| 5,404,373 | 4/1995 | Cheng | 372/50 |
| 5,422,901 | 6/1995 | Lebby et al. | 372/36 |
| 5,552,924 | 9/1996 | Tregilgas | 359/224 |
| 5,572,540 | 11/1996 | Cheng | 372/50 |
| 5,673,284 | 9/1997 | Congdon et al. | 372/50 |
| 5,708,280 | 1/1998 | Lebby et al. | 257/88 |
| 5,710,693 * | 1/1998 | Tsukada et al. | 361/686 |
| 5,789,733 * | 8/1998 | Jachimowicz et al. | 235/492 |
| 5,818,984 * | 10/1998 | Ahmad et al. | 385/14 |
| 5,821,571 * | 10/1998 | Lebby et al. | 257/98 |
| 5,821,614 * | 10/1998 | Hashimoto et al. | 257/679 |
| 6,072,613 * | 6/2000 | Henningsson et al. | 359/152 |
| 6,084,697 * | 7/2000 | Lebby et al. | 359/202 |

\* cited by examiner

*Primary Examiner*—Jeffrey Gaffin
*Assistant Examiner*—David Foster
(74) *Attorney, Agent, or Firm*—George E. Grosser; Andrew Dillon

(57) ABSTRACT

A printed circuit board for coupling surface mounted optoelectric semiconductor devices within a computer system is disclosed. The printed circuit board includes at least one substantially planar surface. There are multiple electrically conductive sites located on the substantially planar surface for connection to a surface mounted semiconductor electronic device. The electrically conductive sites are also connected to electrical interconnects embedded within the printed circuit board. In addition, there are multiple optical pathways terminated at the substantially planar surface for coupling a surface mounted semiconductor optoelectric device.

10 Claims, 6 Drawing Sheets

PRINTED CIRCUIT BOARD FOR COUPLING SURFACE MOUNTED OPTOELECTRIC SEMICONDUCTOR DEVICES

BACKGROUND OF THE INVENTION

1. Technical Field

The present invention relates to printed circuit boards in general, and in particular to a printed circuit board to be utilized in an optoelectric data processing system. Still more particularly, the present invention relates to a printed circuit board for coupling surface mounted semiconductor optoelectric devices within an optoelectric computer system.

2. Description of the Prior Art

Within most computer systems, a bus (or a group of buses) is typically the primary vehicle by which communication among electronic components takes place. Although there are different types of buses, in its most basic form, each bus is simply a series of electrical wires interconnecting various electronic components within a computer system. The electrical transmission characteristics of a bus are defined by the material properties of the bus, the physical geometry of the components, the clock speed of the signals, and the noise within the bus. Thus, both the limitations in materials and the limitations in electronic components contribute to the electrical transmission characteristics of a bus.

As computer systems become more complex, there is a continuing need to drive signals within a bus at a faster clock rate while at the same time minimizing power, noise, and electromagnetic interference. Most if not all of these requirements are met with the advent of optoelectric computer systems. An optoelectric computer system is a computer system in which digital data signals are transmitted in both electrically conductive buses and optical buses (or pathways). Such computer systems may, for example, utilize semiconductor devices that have vertical cavity surface emitting lasers (VCSELs) serving as transducers for optoelectric exchange. One such semiconductor device that is now in commercial use is the HFBR-5303 VCSEL transceiver manufactured by Hewlett Packards. In order to accommodate such devices and therefore benefit from the higher data transfer rates available through optoelectric devices, the present invention provides an improved printed circuit board that supports surface mounted optoelectric semiconductor devices.

SUMMARY OF THE INVENTION

In accordance with a preferred embodiment of the present invention, a printed circuit board includes at least one substantially planar surface. There are multiple electrically conductive sites located on the substantially planar surface for connection to a surface mounted semiconductor electronic device. The electrically conductive sites are also connected to electrical interconnects embedded within the printed circuit board. In addition, there are multiple optical pathways terminated at the substantially planar surface for coupling to a surface mounted semiconductor optoelectric device.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
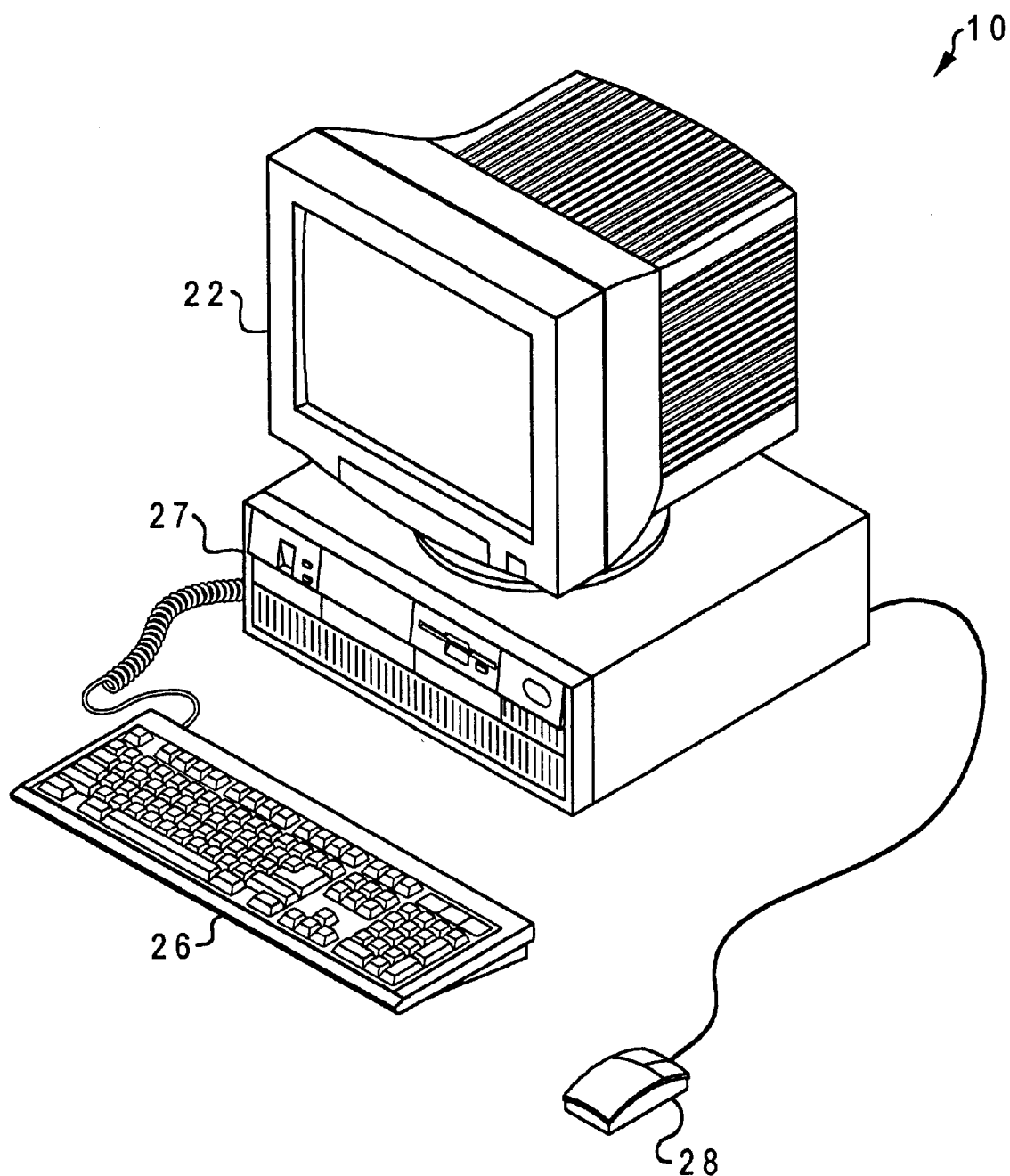
FIG. 1 is a pictorial view of an optoelectric computer system to which a preferred embodiment of the present invention is applicable.
Figure 2:
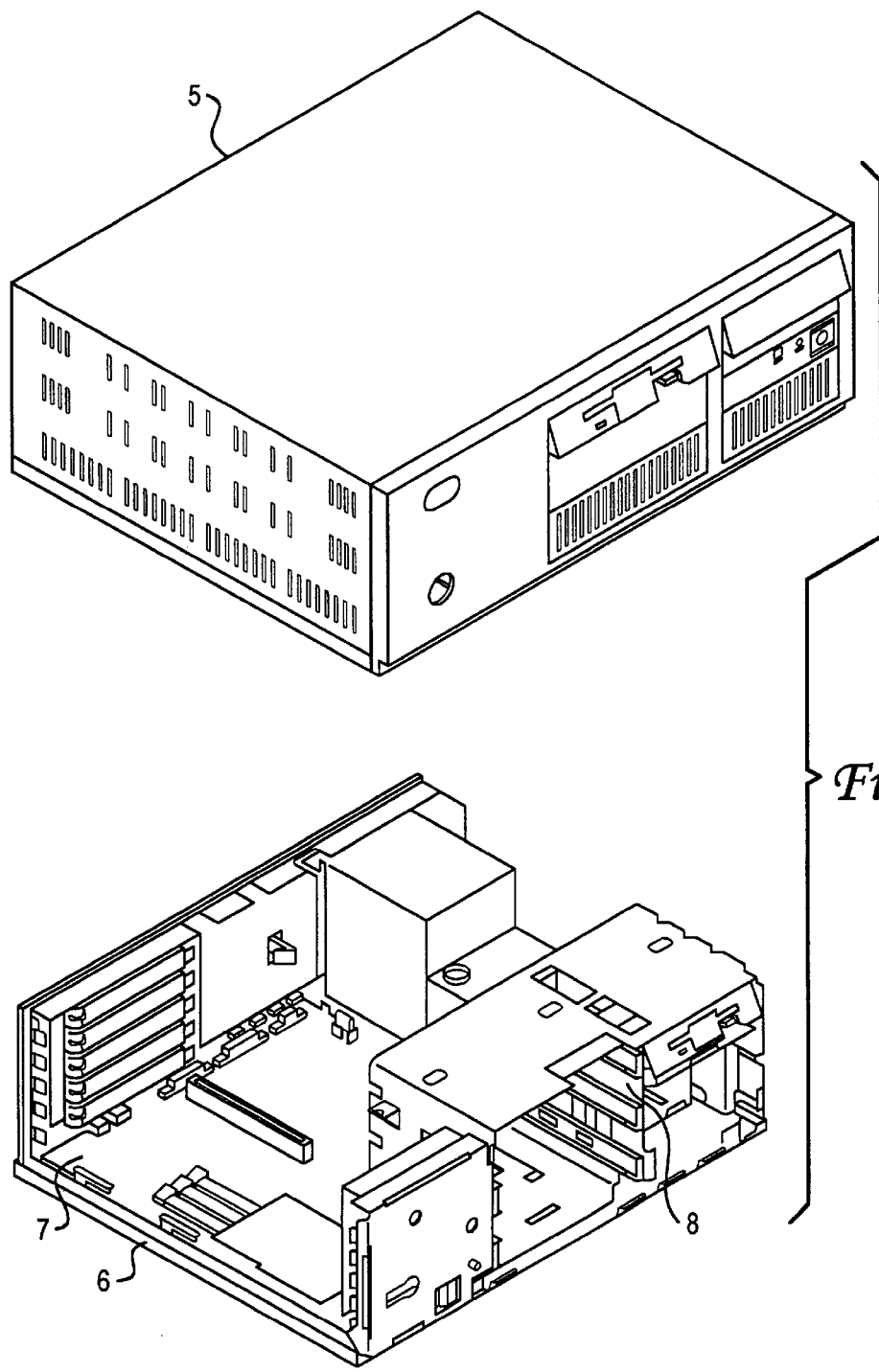
FIG. 2 is an exploded perspective view of various elements within the optoelectric computer system from FIG. 1.

Referring now to the drawings and in particular to FIG. 1, there is depicted a block diagram of an optoelectric computer system to which a preferred embodiment of the present invention is applicable. An optoelectric computer system 10 includes a computer unit 27, a monitor 22, a keyboard 26, and a mouse 28. As shown in FIG. 2, computer unit 27 has a cover 5 that cooperates with a chassis 6 in defining an enclosed, shielded volume for receiving electrically powered data processing components. Some of the data processing components are mounted on a printed circuit board (or motherboard) 7 that is secured within chassis 6. Chassis 6 has a base and a rear panel and defines at least one open bay for receiving a data storage device such as a magnetic disk drive, an optical disk drive, or the like. As shown, an upper bay 8 is adapted to receive a floppy disk drive (not shown).

Figure 3:
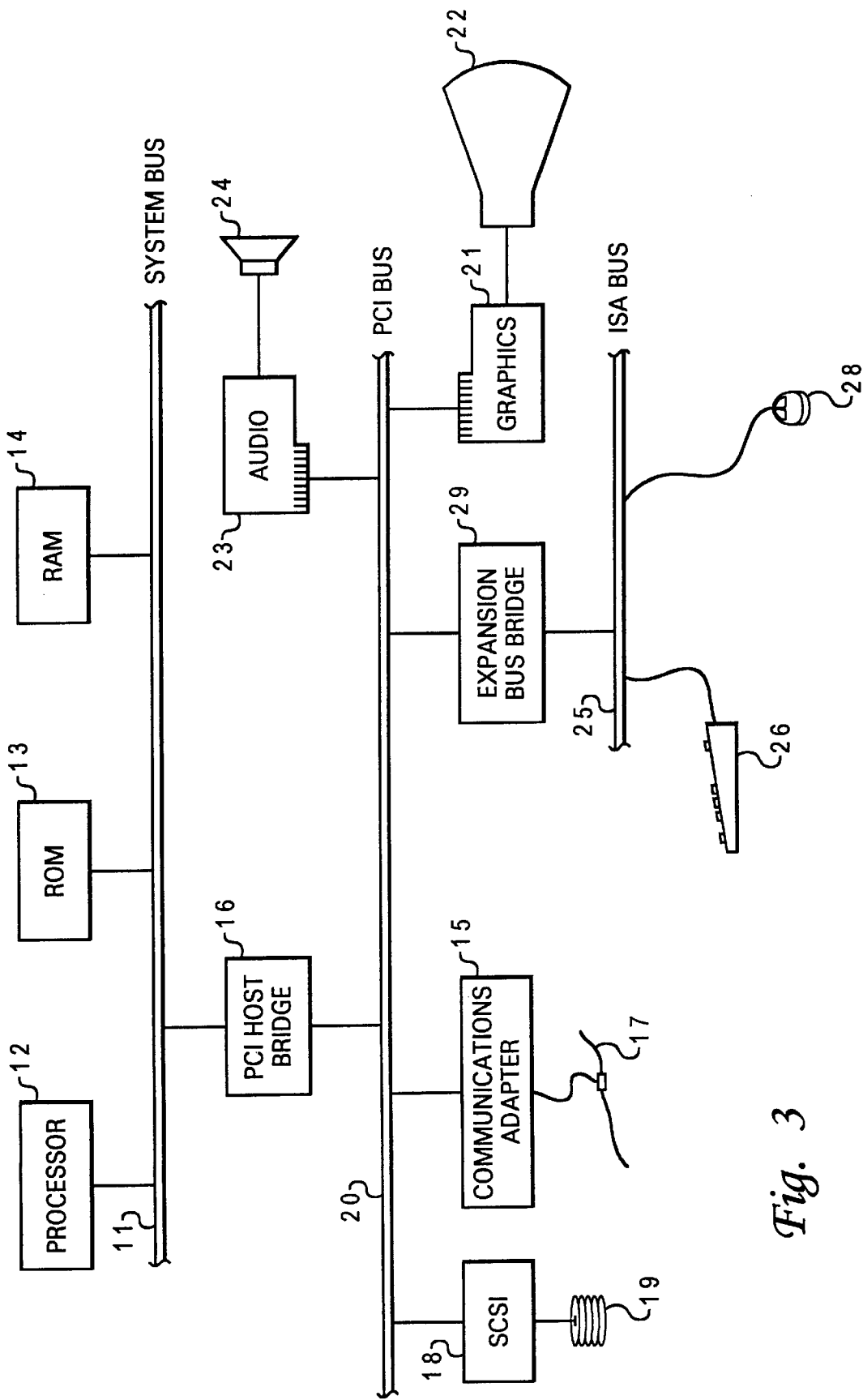
FIG. 3 is a block diagram of various elements of the optoelectric computer system from FIG. 1.

Referring now to FIG. 3, there is illustrated a block diagram of 17 various components within optoelectric computer system 10, including components mounted on printed circuit board 7 and the connection of printed circuit board 7 to the I/O slots. As shown, a processor 12, a read-only memory (ROM) 13, and a Random Access Memory (RAM) 14 are connected to a system bus 11. Processor 12, ROM 13, and RAM 14 are also coupled to a PCI bus 20 of optoelectric computer system 10 through a PCI host bridge 16. PCI host bridge 16 provides a low latency path through which processor 12 may directly access PCI devices mapped anywhere within bus memory and/or I/O address spaces. PCI host bridge 16 also provides a high bandwidth path allowing PCI devices to directly access RAM 14.

Also attached to PCI bus 20 is a communications adapter 15 and a small computer system interface (SCSI) 18. Communications adapter 17 connects optoelectric computer system 10 to a local-area network (LAN) 17. SCSI 18 is utilized to control a high-speed SCSI disk drive 19. Expansion bus bridge 29, such as a PCI-to-ISA bus bridge, may be utilized for coupling an ISA bus 25 to PCI bus 20. As shown, keyboard 26 and mouse 28 are attached to ISA bus 25 for performing certain basic I/O functions. In addition, an audio adapter 23 and a graphics adapter 21 may be attached to PCI bus 20. Graphics adapter 21 controls visual output through monitor 22 and audio adapter 23 controls audio output through a speaker 24.

Figure 4:
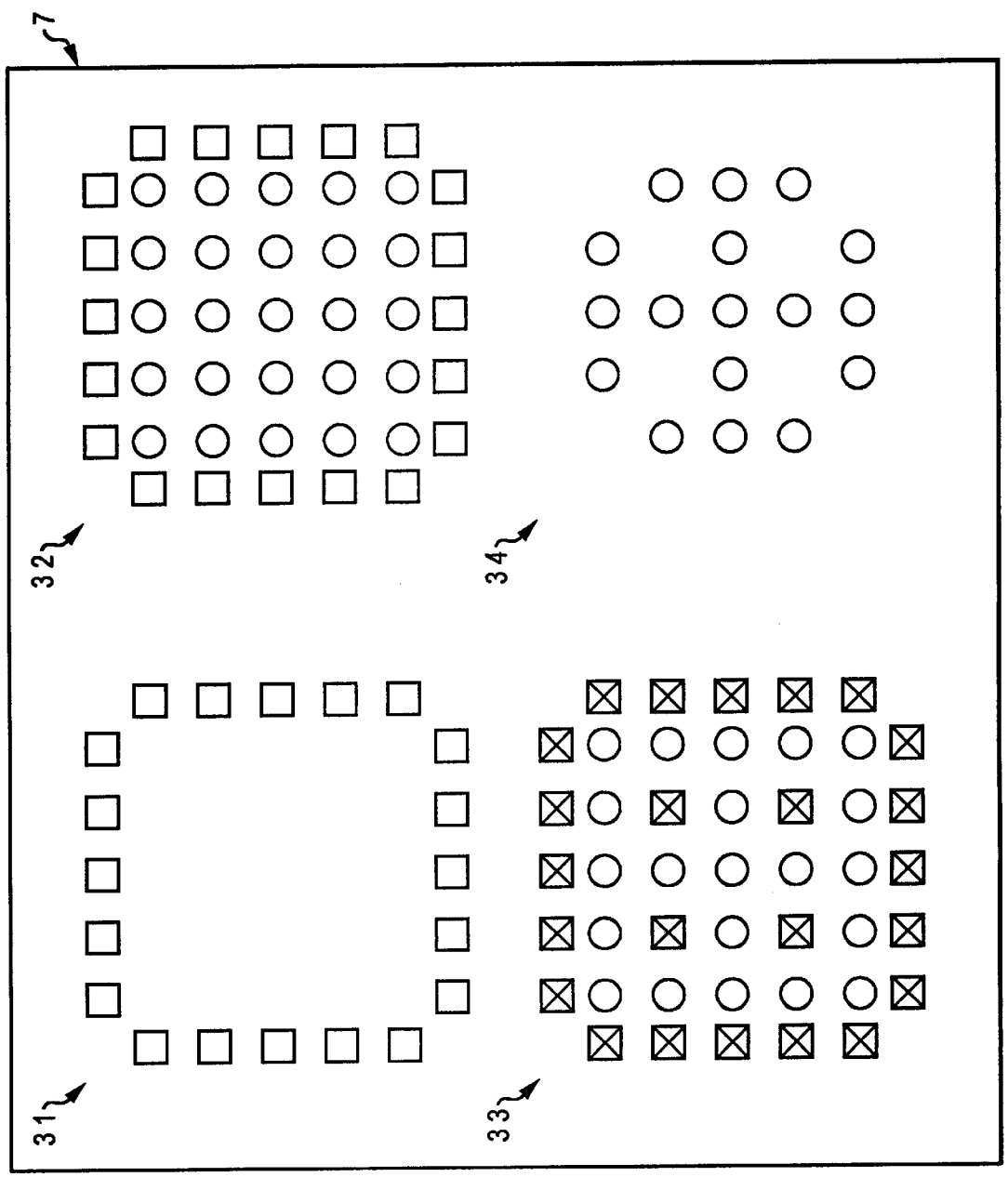
FIG. 4 is a plan view of a printed circuit board used in the optoelectric computer system from FIG. 1.

With reference now to FIG. 4, there is illustrated a top plan view of printed circuit board 7 used in optoelectric computer system 10 of FIG. 1, in accordance with a preferred embodiment of the present invention. For the purpose of illustration, there are only four mounting sites—mounting sites 31–34—included on printed circuit board 7. Each of mounting sites 31–34 is designed to receive a different type of electronic or optoelectric devices. In FIG. 4, each square represents an electrically conductive site located on the surface of printed circuit board 7, each square having an "x" represents an electrically conductive via on printed circuit board 7, and each circle represents an optical pathway terminated at the surface of printed circuit board 7. As shown, mounting site 31 is designed to receive a standard surface mounted electronic device. Each square is a location where a J-lead of a surface mounted electronic device connected to printed circuit board 7. All of mounting sites 32, 33, and 34 are designed to receive an optoelectric device. Mounting site 32 is designed to receive a surface mounted optoelectric device having optical pathways in the bottom surface and surface mounted electrical connections on the edges of the device. Mounting site 33 is designed to receive an optoelectric device having both optical pathways and electrical pin connections at the bottom surface of the device. Mounting pad 34 is intended for a surface mounted optoelectric device having only optical pathways located at the bottom surface of the device, and the surface mounted optoelectric device can be secured to printed circuit board 7 by a convention adhesive.

Figure 5:
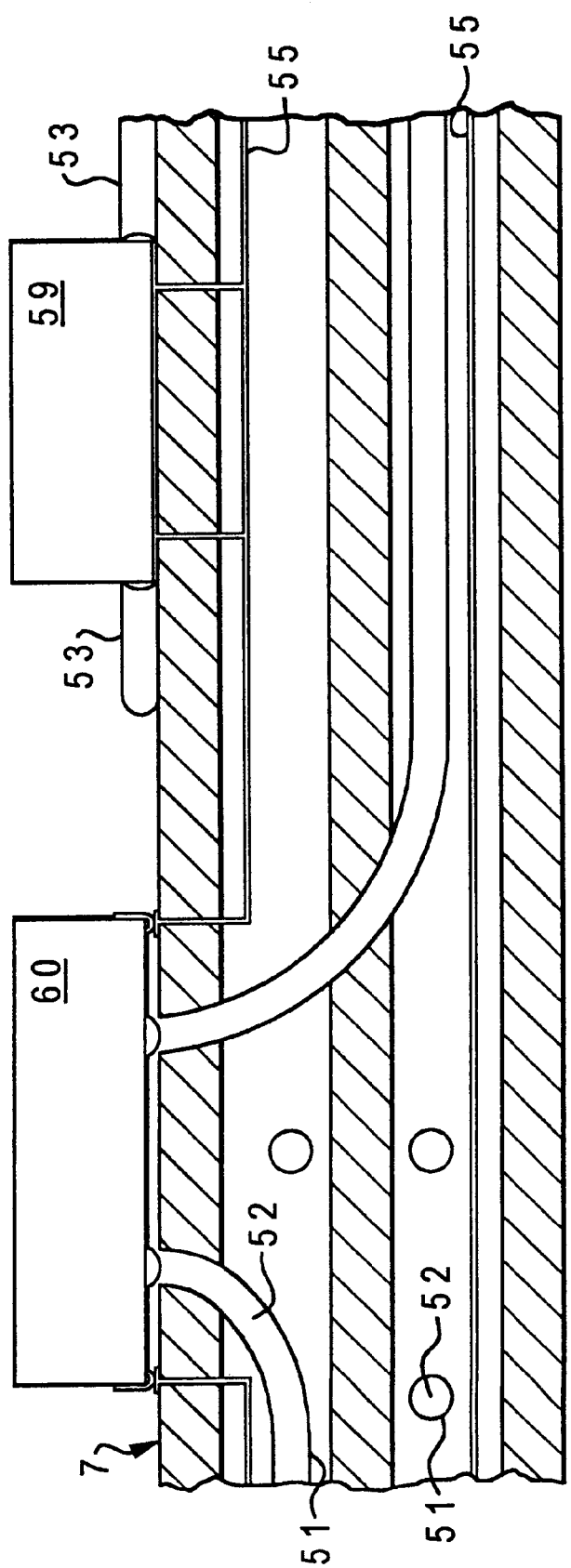
FIG. 5 is a section view of the printed circuit board in accordance with a preferred embodiment of the present invention.

Referring now to FIG. 5, there is illustrated a section view of printed circuit board 7 in accordance with a preferred embodiment of the present invention. As shown, printed circuit board 7 is a three layer laminated board, though more layers can be added. Electrical interconnects 55 are embedded within printed circuit board 7 for the transmission of electrical signals. In addition, optical fibers 51 are embedded within printed circuit board 7 and form an optical pathway 52 for the transmission of optical data. Optical data can be transmitted to optical fibers 51 from a data source by means of a fiber optic bundle (not shown). The fiber optic bundle interfaces with optical fibers 51 embedded within printed circuit board 7 by means of an optical connector (not shown).

A number of optical fibers 51 intended to be connected together and/or brought into signal communication with a surface mounted optoelectric device are led at the time of manufacture to a point within one layer of printed circuit board 7. That point can be an electrical via for electrically connecting internal layers of printed circuit board 7 with a hole of a first diameter, at which a number of fibers may emerge. After fabrication in a conventional manner, a second hole of larger diameter can be countersunk, shearing off optical fibers at what will become a node. This larger hole can then be filled with an optically clear epoxy or other material having a suitable index of refraction for optically coupling the pathways provided by optical fibers 51 with a surface mounted optoelectric device. Alternatively, the via can be formed by broaching a non-circular hole, such as a gear-shaped or multilobed opening. Such a multilobed via can be formed with the optical fiber terminations in the portions of lesser diameter, while the portions of greater diameter provide electrical pathways for electrical connections through the vias.

One approach of providing embedded optical pathways is to form contiguous layers of the laminated board with parallel arrays of optical fibers disposed in perpendicular directions. Thus, optical signals can be routed by simply drilling or otherwise forming holes at where two optical fibers pass adjacent one another and filling, as described above. Another approach for providing optical pathways is to fabricate optical fiber bundles having appropriate lengths and terminations, then position the optical fiber bundles as necessary to optically couple the surface mounted optoelectric devices to be used, and finally adhere the optical fiber bundles either to the surface of an otherwise completed printed circuit board or to the surface of a printed circuit board that will become one layer of a multi-layer lamination.

For the purpose of illustration, FIG. 5 depicts two types of optoelectric device, namely, a pin connected optoelectric device 59 and a surface mounted optoelectric device 60. As shown, pin connected optoelectric device 59, having optical lens on the side of its package, connects to optical fibers 53 that lies on the top surface of printed circuit board 7. Surface mounted optoelectric device 60, having optical lens on the bottom of its package, connects to optical fibers 51 that are embedded within printed circuit board 7.

Figure 6:
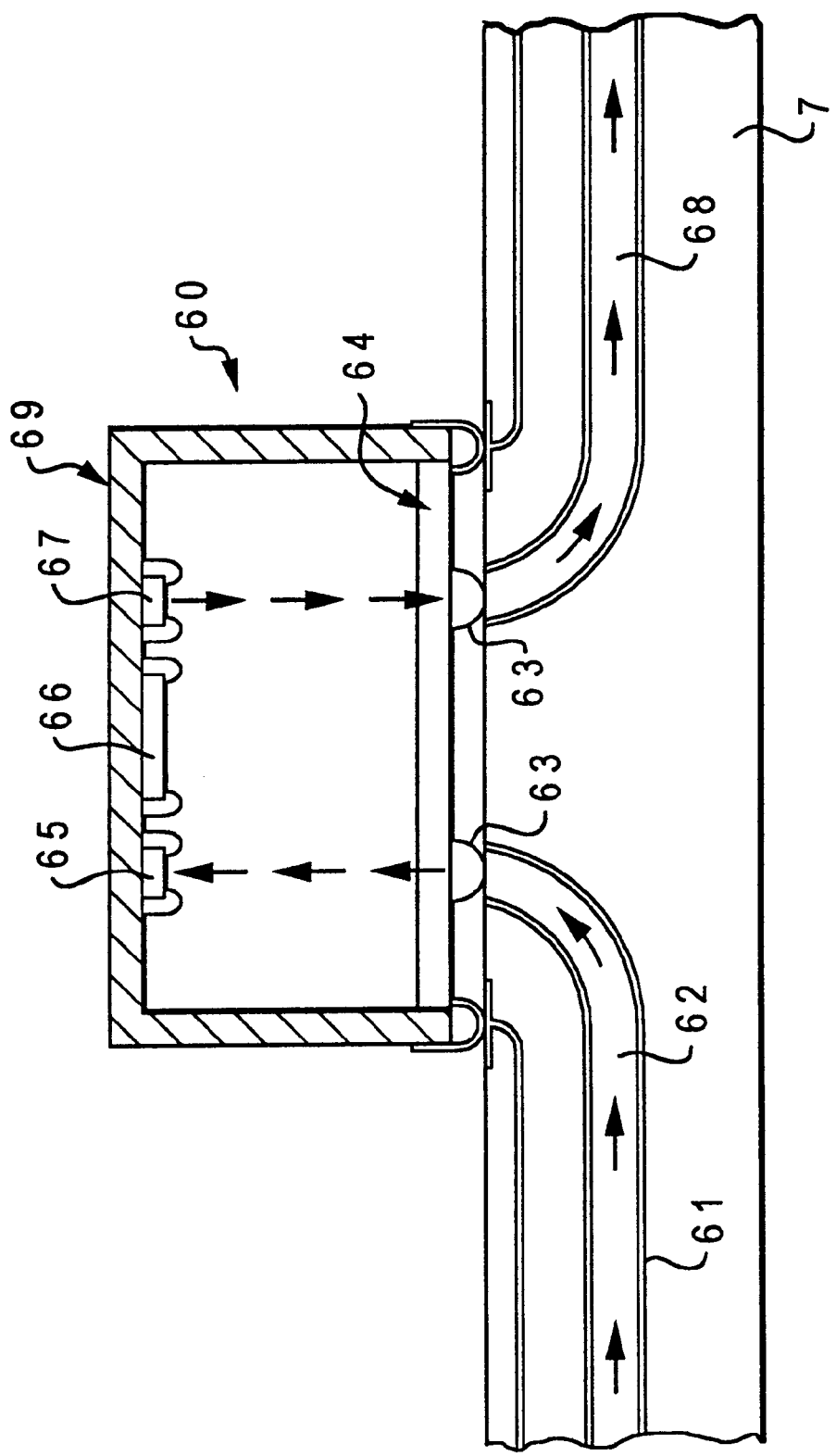
FIG. 6 is a section view of a surface mounted optoelectric device coupled to the printed circuit board from FIG. 5, in accordance with a preferred embodiment of the present invention.

With reference now to FIG. 6, there is illustrated a section view of a surface mounted optoelectric device coupled to printed circuit board 7, in accordance with a preferred embodiment of the present invention. Optical fibers 61 are embedded within printed circuit board 7 and form an optical pathway 62 for the transmission of optical data to a surface mounted optoelectric device 60. Light transmitted along optical pathway 62 passes through an optional lens 63 where light is focused and projected through a clear plastic bottom 64 of surface mounted optoelectric device 60. The light transmitted data signals entering surface mounted optoelectric device 60 are received by a photo transistor chip 65, such as a VCSEL chip, where the light signals are converted into electrical signals. The electrical signals are conducted by wire connections to an integrated circuit chip 66. The same electrically transmitted data is also conducted by circuitry to a photo transmitter chip 67, such as a VCSEL chip, that is positioned within surface mounted optoelectric device 60 to emit light signals into another optical pathway 68.

Although both optical pathways 62 and 68 as shown are unidirectional, dual or bi-directional optical pathways may be utilized. In addition, optical pathways 62 and 68 are preferably provided by an array of optical fibers, with bundles or groups of the fibers forming pathways between and among different surface mounted optoelectric devices. The bundles or groups are brought to terminations that are at the substantially planar surface of printed circuit board 7 and oriented for optical coupling to the surface mounted optoelectric devices. The bundles or groups may be adhered to the surface of printed circuit board 7 or formed within printed circuit board 7 as part of a lamination manufacturing process.

Photo transistor chip 65, integrated circuit chip 66, and photo transmitter chip 67 are attached to a ceramic substrate 69 with epoxy in a manner that is standard in the industry. Similarly, the electrical connections between photo transistor chip 65, integrated circuit chip 66, and photo transmitter chip 67 are accomplished by wire bonding that is also standard in the industry. Substrate 69 and the side of surface mounted optoelectric device 60, in a preferred embodiment, are opaque to avoid the entrance of extraneous light to the interior of surface mounted optoelectric device 60. Non-opaque materials could be used, however, if surface mounted optoelectric device 60 is otherwise shielded from extraneous light. In addition, surface mounted optoelectric device 60 has a clear plastic bottom 64 such that the use of lens 63 is optional.

As has been described, the present invention provides a printed circuit board for receiving surface mounted optoelectric semiconductor devices. According to the present invention, a printed circuit board includes both optical pathways and electrical interconnects, and that the optical pathways are terminated at a surface of the printed circuit board in order to accommodate surface mounted optoelectric semiconductor devices.

While the invention has been particularly shown and described with reference to a preferred embodiment, it will be understood by those skilled in the art that various changes in form and detail may be made therein without departing from the spirit and scope of the invention.

What is claimed is:

1. A printed circuit board, comprising:
    at least one substantially planar surface;
    a plurality of electrical interconnects;
    a plurality of electrically conductive sites located on said at least one substantially planar surface for connection to a surface mounted semiconductor electronic device, wherein said plurality of electrically conductive sites are connected to said plurality of electrical interconnects; and
    a plurality of optical pathways terminated at said at least one substantially planar surface for coupling a surface mounted semiconductor optoelectric device.

2. The printed circuit board according to claim 1, wherein said surface mounted semiconductor optoelectric device has only electrical leads.

3. The printed circuit board according to claim 1, wherein said surface mounted semiconductor optoelectric device has electrical leads and optical lens.

4. The printed circuit board according to claim 1, wherein said electrically conductive sites are electrically conductive pads.

5. The printed circuit board according to claim 1 wherein said electrically conductive sites are electrically conductive vias.

6. A computer system, comprising:
    a plurality of electronic and optoelectric devices; and
    a printed circuit board in which said plurality of electronic and optoelectric device are mounted, wherein said printed circuit board includes:
    at least one substantially planar surface;
    a plurality of electrical interconnects;
    a plurality of electrically conductive sites located on said at least one substantially planar surface for connection to a surface mounted semiconductor electronic device, wherein said plurality of electrically conductive sites are connected to said plurality of electrical interconnects; and
    a plurality of optical pathways terminated at said at least one substantially planar surface for coupling a surface mounted semiconductor optoelectric device.

7. The computer system according to claim 6, wherein said surface mounted semiconductor optoelectric device has only electrical leads.

8. The computer system according to claim 6, wherein said surface mounted semiconductor optoelectric device has electrical leads and optical lens.

9. The computer system according to claim 6, wherein said electrically conductive sites are electrically conductive pads.

10. The computer system according to claim 6, wherein said electrically conductive sites are electrically conductive vias.

* * * * *